(12) United States Patent
Roessler et al.

(10) Patent No.: US 11,277,900 B2
(45) Date of Patent: Mar. 15, 2022

(54) PRINTED CIRCUIT BOARDS FOR POWER SUPPLIES

(71) Applicant: ABB Power Electronics Inc., Plano, TX (US)

(72) Inventors: Robert Joseph Roessler, Wylie, TX (US); Anjana Shyamsundar, McKinney, TX (US)

(73) Assignee: ABB Power Electronics Inc., Plano, TX (US)

( * ) Notice: Subject to any disclaimer, the term of this patent is extended or adjusted under 35 U.S.C. 154(b) by 0 days.

(21) Appl. No.: 17/087,822

(22) Filed: Nov. 3, 2020

(65) Prior Publication Data

US 2021/0274636 A1    Sep. 2, 2021

Related U.S. Application Data

(63) Continuation of application No. 16/806,058, filed on Mar. 2, 2020, now Pat. No. 10,827,602.

(51) Int. Cl.
*H05K 1/02* (2006.01)

(52) U.S. Cl.
CPC ... *H05K 1/0207* (2013.01); *H05K 2201/0358* (2013.01); *H05K 2201/062* (2013.01);
(Continued)

(58) Field of Classification Search
CPC ......... H05K 1/0207; H05K 2201/0358; H05K 2201/062; H05K 2201/093;
(Continued)

(56) References Cited

U.S. PATENT DOCUMENTS 5,120,384 A * 6/1992 Yoshimitsu ........... B29C 70/865
156/242
5,672,226 A * 9/1997 Deardorf .............. H05K 3/4614
156/288

(Continued)

OTHER PUBLICATIONS

Berquist Thermal Clad, HT-07006 (High Temperature) Technical Data, Downloaded from www.berquistcompany.com, 2 pages.
(Continued)

*Primary Examiner* — Sherman Ng
(74) *Attorney, Agent, or Firm* — Armstrong Teasdale LLP

(57) ABSTRACT

At least one embodiment of a power supply includes a printed circuit board formed from a plurality of double-sided laminates and a plurality of thermally conductive, electrically insulating pre-preg sheets interleaved with the plurality of double-sided laminates. Each double-sided laminate illustratively includes an electrically insulating core, a first patterned layer of electrically conductive material arranged on a first side of the electrically insulating core, and a second patterned layer of electrically conductive material arranged on a second side of the electrically insulating core opposite the first side. The printed circuit board illustratively further includes a thermally conductive, electrically insulating additive resin filling spaces between the electrically conductive material in both the first and second patterned layers of each of the plurality of double-sided laminates, such that the electrically conductive material and the additive resin together form planar surfaces that contact the plurality of pre-preg sheets.

19 Claims, 3 Drawing Sheets

(52) U.S. Cl.
CPC ................ *H05K 2201/093* (2013.01); *H05K 2201/09309* (2013.01)

(58) Field of Classification Search
CPC ....... H05K 2201/09309; H05K 3/4635; H05K 3/4626; H05K 2201/0195; H05K 3/462
USPC .......................................................... 174/252
See application file for complete search history.

(56) References Cited

U.S. PATENT DOCUMENTS

| | | | |
|---|---|---|---|
| 10,827,602 B1 | 11/2020 | Roessler et al. | |
| 2002/0157859 A1* | 10/2002 | Vasoya | B32B 27/12 174/250 |
| 2005/0224251 A1* | 10/2005 | Memis | H05K 3/4602 174/255 |
| 2008/0254313 A1* | 10/2008 | Kennedy | H05K 3/4626 428/620 |
| 2015/0030824 A1* | 1/2015 | Crosley | H05K 1/024 428/206 |
| 2016/0120018 A1* | 4/2016 | Chang | H05K 1/0298 333/1 |
| 2016/0128180 A1* | 5/2016 | Kuo | H05K 3/4602 174/251 |
| 2016/0165714 A1* | 6/2016 | Chen | H05K 3/4602 174/250 |
| 2016/0362527 A1* | 12/2016 | Koes | C08J 5/24 |

OTHER PUBLICATIONS

San-Ei Kaguku Co., Ltd., Products Information, UC-3000, UC-3400 series, downloaded from www.san-eikagaku.com/e_electron/product/?ca=28, 2 pages.
Laird, Tlam SS HTD03, Thermally Conductive PCB Substrate (High Temperature), downloaded from www.lairdtech.com/THR-DS-Tlam-SS/HTD03/1115, 2 pages.
Laird, Thermal Interface Solutions, downloaded from www.lairdtech.com/THR-BRO-THERMINTERFACE-SOL090817, 8 pages.
San-Ei Kaguku Co., Ltd., Products Information, Undercoat ink/UC-3000, UC-3400 series, downloaded from www.san-eikagaku.com/e_electron/product/?ca=11, 2 pages.
Berquist Thermal Clad, HPL-03015 (High Power Lighting) Technical Data, Superior Dielectric Lowers Operating Temperatures, downloaded from www.berquistcompany.com, 2 pages.

\* cited by examiner

PRINTED CIRCUIT BOARDS FOR POWER SUPPLIES

This application is a continuation of U.S. patent application Ser. No. 16/806,058, filed Mar. 2, 2020, now issued as U.S. Pat. No. 10,827,602, the entire disclosure of which is incorporated herein by reference.

TECHNICAL FIELD

The present disclosure relates generally to printed circuit boards for power supplies and, more particularly, to printed circuit boards in which a plurality of thermally conductive, electrically insulating pre-preg sheets are interleaved with a plurality of double-sided laminates and in which a thermally conductive, electrically insulating additive resin fills spaces between electrically conductive material of the plurality of double-sided laminates.

BACKGROUND

Heavy copper printed circuit boards, with greater than 2 ounce copper, typically require a large amount of resin to fill the copper removed during the etching process. The heavier the copper weight, the more resin is needed. Additionally, separation between copper planes grows as glass carrying the resin creates a thickness between the copper planes. Furthermore, traditional resin in the glass does not have very good thermal properties. Currently, printed circuit board layouts uses thermal vias, copper planes, and metal substrate printed circuit boards to remove or distribute heat. Hot spots across the printed circuit board may require additional design and process steps to remove heat through thermal compounds or heat sinks on the components of the printed circuit board.

As power supplies become smaller due to efficiency gains, thermal performance and thermal efficiency become more critical. Currently, integrated metal substrate printed circuit boards or metal-backed printed circuit boards are used to address thermal issues. Additionally, thermal vias are used to pull heat away from the printed circuit board. A variety of thermal compounds or gap fillers are also used to pull heat away from the components on the printed circuit board. These compounds are used to minimize the hot spots on the printed circuit board.

SUMMARY

According to one aspect of the present disclosure, a power supply is disclosed. A printed circuit board of the power supply may comprise a plurality of double-sided laminates and a plurality of thermally conductive, electrically insulating pre-preg sheets interleaved with the plurality of double-sided laminates. Each double-sided laminate of the plurality of double-sided laminates may comprise an electrically insulating core, a first patterned layer of electrically conductive material arranged on a first side of the electrically insulating core, and a second patterned layer of electrically conductive material arranged on a second side of the electrically insulating core opposite the first side. The printed circuit board may further comprise a thermally conductive, electrically insulating additive resin filling spaces between the electrically conductive material in both the first and second patterned layers of each of the plurality of double-sided laminates, such that the electrically conductive material and the additive resin together form planar surfaces that contact the plurality of pre-preg sheets.

In some embodiments, each one of the plurality of pre-preg sheets contacts both (i) the first patterned layer of one of the plurality of double-sided laminates and (ii) the second patterned layer of another one of the plurality of double-sided laminates.

In some embodiments, the first patterned layer of one of the plurality of double-sided laminates may be spaced less than 4 mils from the second patterned layer of another one of the plurality of double-sided laminates.

In some embodiments, each of the plurality of pre-preg sheets has a thermal conductivity greater than 2 Watts/meter-Kelvin.

In some embodiments, the electrically insulating core of each of the plurality of double-sided laminates comprises a cured pre-preg sheet having a thermal conductivity greater than 2 Watts/meter-Kelvin.

In some embodiments, the additive resin has a thermal conductivity greater than 0.3 Watts/meter-Kelvin.

In some embodiments, each of the plurality of pre-preg sheets and the additive resin may provide dielectric isolation of at least 500 Volts/mil.

In some embodiments, a thermal performance of the printed circuit board may be more uniform than and at least 7 percent more efficient than another printed circuit board lacking the additive resin.

In some embodiments, the power supply may comprise a quarter-brick power converter with greater than 95 percent efficiency.

According to another aspect of the present disclosure, a double-sided laminate for fabricating a printed circuit board for a power supply is disclosed. The double-sided laminate may comprise an electrically insulating pre-preg sheet having a thermal conductivity greater than 2 Watts/meter-Kelvin, a first layer of electrically conductive material arranged on a first side of the electrically insulating pre-preg sheet, and a second layer of electrically conductive material arranged on a second side of the electrically insulating pre-preg sheet opposite the first side.

In some embodiments, the electrically insulating pre-preg sheet may provide dielectric isolation of at least 1000 Volts/mil.

In some embodiments, the first and second layers of electrically conductive material are each patterned. In such embodiments, a thermally conductive, electrically insulating additive resin may fill spaces between the electrically conductive material in both the first and second patterned layers, such that the electrically conductive material and the additive resin together form planar outer surfaces of the double-sided laminate.

In some embodiments, the additive resin has a thermal conductivity greater than 0.3 Watts/meter-Kelvin.

In some embodiments, the pre-preg sheet and the additive resin may each provide dielectric isolation of at least 1000 Volts/mil.

According to yet another aspect of the present disclosure, a method for fabricating a printed circuit board for a power supply may comprise applying a thermally conductive, electrically insulating additive resin to fill spaces between patterned electrically conductive material arranged on a first side of a first electrically insulating core, such that the electrically conductive material and the additive resin together form a first planar surface on the first side of the first core, applying the additive resin to fill spaces between patterned electrically conductive material arranged on a second side of a second electrically insulating core, such that the electrically conductive material and the additive resin together form a second planar surface on the second side of the second core, contacting the first planar surface with a first side of a first thermally conductive, electrically insulating pre-preg sheet, and contacting the second planar surface with a second side of the first pre-preg sheet, the second side of the first pre-preg sheet being opposite the first side of the first pre-preg sheet.

In some embodiments, the method may further comprise applying energy to transition the pre-preg sheet from a B-stage to a C-stage.

In some embodiments, the first pre-preg sheet has a thermal conductivity greater than 2 Watts/meter-Kelvin.

In some embodiments, the first and second cores are each a C-stage pre-preg sheet having a thermal conductivity greater than 2 Watts/meter-Kelvin.

In some embodiments, the additive resin has a thermal conductivity greater than 0.3 Watts/meter-Kelvin.

In some embodiments, the first pre-preg sheet and the additive resin may each provide dielectric isolation of at least 500 Volts/mil.

In some embodiments, the method may further comprise applying the additive resin to fill spaces between patterned electrically conductive material arranged on a second side of the first electrically insulating core, the second side of the first core being opposite the first side of the first core, such that the electrically conductive material and the additive resin together form a third planar surface on the second side of the first core, applying the additive resin to fill spaces between patterned electrically conductive material arranged on a first side of the second core, such that the electrically conductive material and the additive resin together form a fourth planar surface on the second side of the second core, contacting the third planar surface with a second thermally conductive, electrically insulating pre-preg sheet, and contacting the fourth planar surface with a third thermally conductive, electrically insulating pre-preg sheet.

In some embodiments, the first, second, and third pre-preg sheets each have a thermal conductivity greater than 2 Watts/meter-Kelvin and may each provide dielectric isolation of at least 500 Volts/mil.

In some embodiments, the additive resin has a thermal conductivity greater than 0.3 Watts/meter-Kelvin and may provide dielectric isolation of at least 500 Volts/mil.

BRIEF DESCRIPTION OF THE DRAWINGS

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. The detailed description particularly refers to the accompanying figures in which.

DETAILED DESCRIPTION OF THE DRAWINGS

Figure 1:
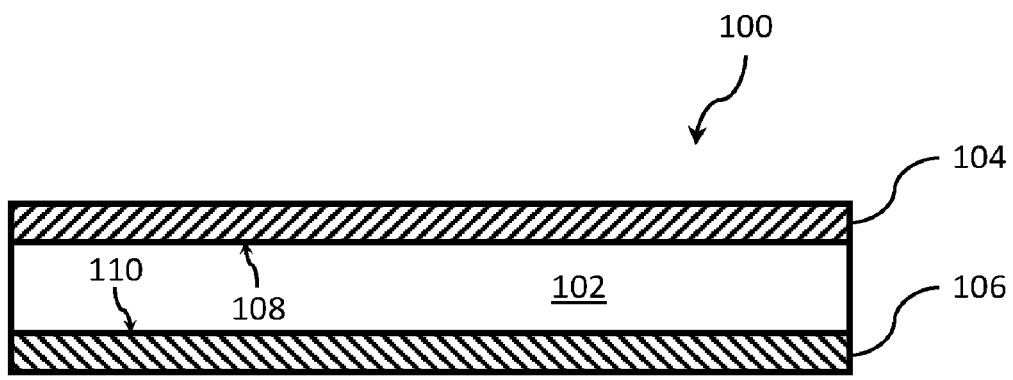
FIG. 1 is an illustrative diagram showing a cross-section of a double-sided laminate according to the prior art.

While the concepts of the present disclosure are susceptible to various modifications and alternative forms, specific embodiments thereof have been shown by way of example in the figures and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

One illustrative embodiment of a prior art double-sided laminate 100, useful in fabricating printed circuit boards for power supplies, is illustrated in cross-section in FIG. 1. The double-sided laminate 100 comprises an electrically insulating core 102, a layer 104 of electrically conductive material arranged on a side 108 of the electrically insulating core 102, and a layer 106 of electrically conductive material arranged on another side 110 of the electrically insulating core 102 that is opposite the side 108. In this embodiment, the electrically insulating core 102 may comprise one or more traditional pre-preg sheets, such as electrical grade glass (e-glass) impregnated with resin. The traditional pre-preg sheet(s) 102 may comply with one or more of the IPC-4101 specifications published by the Institute of Printed Circuits, which specifications are incorporated herein by reference.

The double-sided laminate 100 may be formed by laminating each of the layers 104, 106 to one of the opposing sides 108, 110 of the electrically insulating core 102 while the electrically insulating core 102 is at a B-stage (semi-cured). After the layers 104, 106 are arranged on the opposing sides 108, 110 of the electrically insulating core 102, the double-sided laminate 100 may be cured. For instance, energy may be applied to the double-sided laminate 100 to transition the electrically insulating core 102 from the B-stage to a C-stage, bonding the components of the double-sided laminate 100 together.

The electrically conductive material of the layers 104, 106 may comprise a metal, such as copper. By way of example, the layers 104, 106 may be sheets of copper foil. It is contemplated that other electrically conductive materials (e.g., carbon nanostructures) could be used to form the layers 104, 106. One of both of the layers 104, 106 may be patterned to form traces of electrically conductive material separated by spaces (where the electrically conductive material of the layer 104, 106 has been removed). For instance, one or both of the layers 104, 106 may be patterned using etching, machining, or other patterning techniques known to those skilled in the art.

Figure 2:
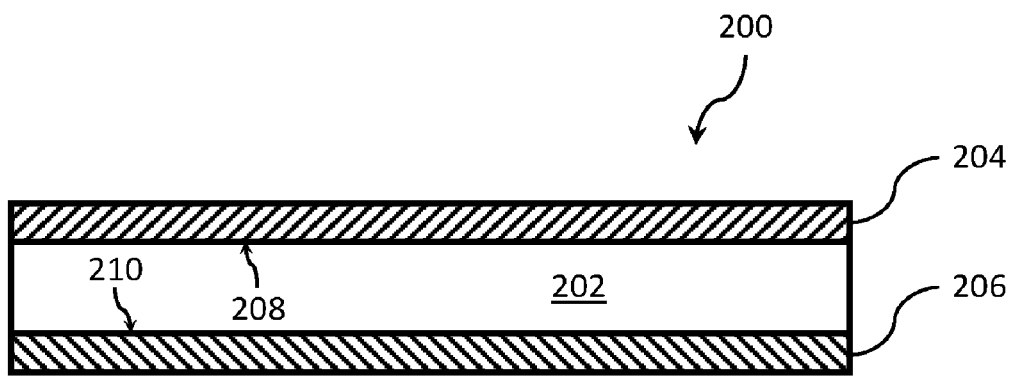
FIG. 2 is an illustrative diagram showing a cross-section of a double-sided laminate according to the present disclosure.

One illustrative embodiment of a novel double-sided laminate 200, with improved utility for fabricating printed circuit boards for power supplies, is illustrated in cross-section in FIG. 2. The double-sided laminate 200 comprises an electrically insulating core 202, a layer 204 of electrically conductive material arranged on a side 208 of the electrically insulating core 202, and a layer 206 of electrically conductive material arranged on another side 210 of the electrically insulating core 202 that is opposite the side 208. In this embodiment, the electrically insulating core 202 may comprise a pre-preg sheet having a thermal conductivity greater than 2 Watts/meter-Kelvin. It is also contemplated that the pre-preg sheet 202 may have a thermal conductivity greater than 2.5 Watts/meter-Kelvin, greater than 3 Watts/meter-Kelvin, or even greater than 3.5 Watts/meter-Kelvin, in some embodiments. The pre-preg sheet 202 may provide dielectric isolation between the layers 204, 206 of at least 500 Volts/mil. It is also contemplated that, in some embodiments, the pre-preg sheet 202 may provide dielectric isolation of at least 750 Volts/mil, at least 1000 Volts/mil, or at least 1500 Volts/mil. For instance, in some illustrative embodiments, the pre-preg sheet 202 may be formed of Tpreg™ 1KA material, commercially available from Laird Technologies, Inc. In other illustrative embodiments, the pre-preg sheet 202 may be formed of Tlam™ SS HTD material, also commercially available from Laird Technologies, Inc.

The double-sided laminate 200 may be formed by laminating each of the layers 204, 206 to one of the opposing sides 208, 210 of the electrically insulating core 202 while the electrically insulating core 202 is at a B-stage (semi-cured). After the layers 204, 206 are arranged on the opposing sides 208, 210 of the electrically insulating core 202, the double-sided laminate 200 may be cured. For instance, energy may be applied to the double-sided laminate 200 to transition the electrically insulating core 202 from the B-stage to a C-stage, bonding the components of the double-sided laminate 200 together.

The electrically conductive material of the layers 204, 206 may comprise a metal, such as copper. By way of example, the layers 204, 206 may be sheets of copper foil. It is contemplated that other electrically conductive materials (e.g., carbon nanostructures) could be used to form the layers 104, 106. One of both of the layers 204, 206 may be patterned to form traces of electrically conductive material separated by spaces (where the electrically conductive material of the layer 204, 206 has been removed). For instance, one or both of the layers 204, 206 may be patterned using etching, machining, or other patterning techniques known to those skilled in the art.

Figure 3:
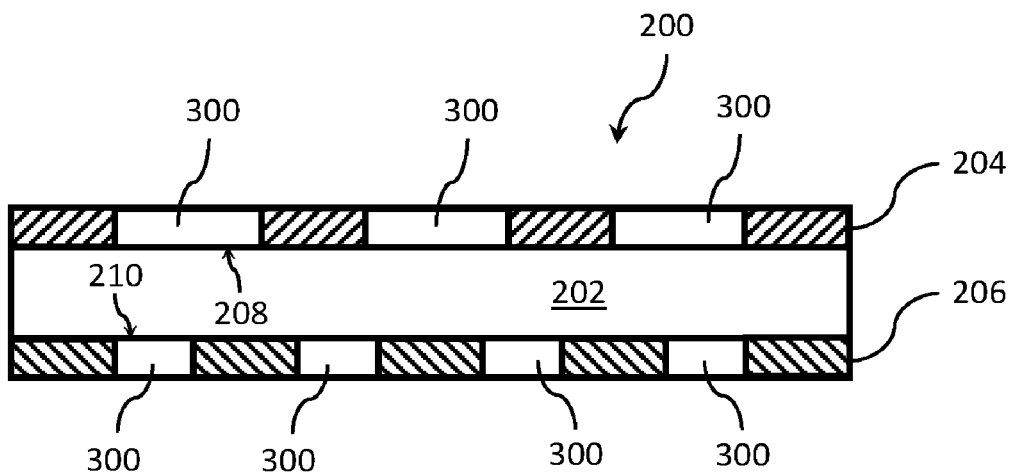
FIG. 3 is an illustrative diagram showing a cross-section of the double-sided laminate of FIG. 2 after the addition of a thermally conductive, electrically insulating additive resin.

Referring now to FIG. 3, the double-sided laminate 200 of FIG. 2 is shown (in cross-section) after the layers 204, 206 have each been patterned to form traces of electrically conductive material separated by spaces. As illustrated in FIG. 3, the spaces between the electrically conductive material in both the patterned layers 204, 206 have been filled with a thermally conductive, electrically insulating additive resin 300. In some embodiments, the additive resin 300 may have a thermal conductivity greater than 0.2 Watts/meter-Kelvin, greater than 0.3 Watts/meter-Kelvin, or even greater than 0.4 Watts/meter-Kelvin. The additive resin 300 may provide dielectric isolation between the layers 204, 206 of at least 500 Volts/mil, at least 750 Volts/mil, at least 1000 Volts/mil, or at least 1500 Volts/mil, in some embodiments. For instance, in some illustrative embodiments, the additive resin 300 may be formed of UCP 50A-4 material, commercially available from SAN-EI Kagaku Co., Ltd.

As can be seen in FIG. 3, after the spaces between the electrically conductive material of the patterned layers 204, 206 has been filled with the additive resin 300, the electrically conductive material of the patterned layers 204, 206 and the additive resin 300 together form planar outer surfaces of the double-sided laminate 200. These planar surfaces are beneficial when assembling a plurality of the double-sided laminates 200 into a printed circuit board (as discussed further below), reducing the overall thickness of the printed circuit board, while improving its thermal conductivity. The additive resin 300 can be applied in the same manner to spaces between the electrically conductive material of the patterned layers 104, 106 of the double-sided laminate 100, such that the electrically conductive material of the patterned layers 104, 106 and the additive resin 300 together form planar outer surfaces of the double-sided laminate 100.

Figure 4:
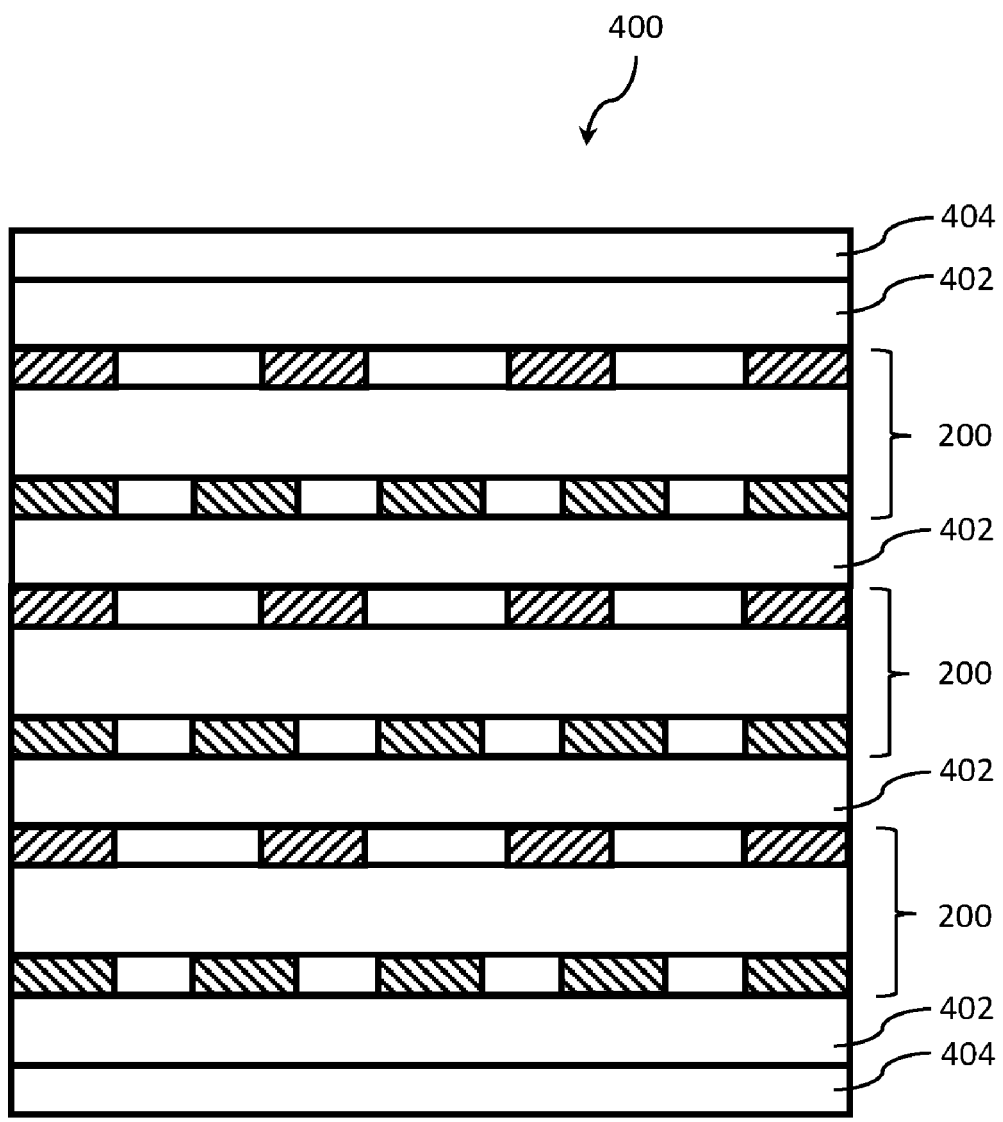
FIG. 4 is an illustrative diagram showing a cross-section of a printed circuit board according to the present disclosure, assembled from a plurality of the double-sided laminates of FIG. 3.

A printed circuit board ("PCB") 400 according to the present disclosure is illustratively shown in cross-section in FIG. 4. The PCB 400 is assembled from a plurality of the double-sided laminates 200, among other components. While the PCB 400 includes three of the double-sided laminates 200 in the illustrative embodiment of FIG. 4, it is contemplated that the PCB 400 may include any number of double-sided laminates 200 in other embodiments. The features of the double-sided laminates 200 are substantially the same as discussed above with reference to FIGS. 2 and 3 (as such, the component parts of the double-sided laminates 200 have not been labelled in FIG. 4 so as not to obscure the disclosure).

The PCB 400 further includes a plurality of thermally conductive, electrically insulating pre-preg sheets 402 interleaved with the plurality of double-sided laminates 200. In this embodiment, each of the pre-preg sheets 402 has a thermal conductivity greater than 2 Watts/meter-Kelvin. It is also contemplated that the pre-preg sheets 402 may each have a thermal conductivity greater than 2.5 Watts/meter-Kelvin, greater than 3 Watts/meter-Kelvin, or even greater than 3.5 Watts/meter-Kelvin, in some embodiments. The pre-preg sheets 402 may provide dielectric isolation between adjacent layers 204, 206 (of different double-sided laminates 200) of at least 500 Volts/mil. It is also contemplated that, in some embodiments, the pre-preg sheets 402 may provide dielectric isolation of at least 750 Volts/mil, at least 1000 Volts/mil, or at least 1500 Volts/mil. For instance, in some illustrative embodiments, the pre-preg sheets 402 may be formed of Tpreg™ 1KA material or of Tlam™ SS HTD material, both commercially available from Laird Technologies, Inc. The plurality of pre-preg sheets 402 may be arranged between the plurality of double-sided laminates 200 while at a B-stage (semi-cured). After the components of the PCB 400 have been stacked, the plurality of pre-preg sheets 402 may be cured. For instance, energy may be applied to the PCB 400 to transition the plurality of pre-preg sheets 402 from the B-stage to a C-stage, bonding the components of the PCB 400 together.

As discussed above, each of the double-sided laminates 200 includes a thermally conductive, electrically insulating additive resin 300 filling spaces between the electrically conductive material in both the patterned layers 204, 206 of each of the plurality of double-sided laminates 200. As a result, the electrically conductive material of the patterned layers 204, 206 and the additive resin 300 together form planar surfaces that contact the plurality of pre-preg sheets 402. These planar surfaces of the double-sided laminates 200 facilitate stacking with the plurality of pre-preg sheets 402, allowing for only a single pre-preg sheet 402 to be used to join adjacent double-sided laminates 200. For instance, in some embodiments, adjacent double-sided laminates 400 may be spaced apart by less than 5 mils, less than 4 mils, or even less than 3 mils. In particular, the patterned layer 204 of one of the double-sided laminates 200 may be spaced less than 5 mils, less than 4 mils, or even less than 3 mils away from the patterned layer 206 of another one of the double-sided laminates 200. This reduced spacing decreases the overall thickness of the PCB 400 and increases thermal conductivity of the PCB 400. In one embodiment, the thermal conductivity of PCB 400 in the Z-direction (perpendicular to the planar surfaces just discussed) was improved by about 7 percent. In other words, the thermal performance was about 7 percent more efficient than comparative PCBs lacking the additive resin 300. Furthermore, the thermal performance of the PCB 400 was also more uniform than comparative PCBs lacking the additive resin 300 (i.e., hot spots in the PCB 400 were reduced and/or eliminated).

As shown in FIG. 4, two of the plurality of pre-preg sheets 402 each contact both the patterned layer 204 of one of the plurality of double-sided laminates 200 and the patterned layer 206 of another one of the plurality of double-sided laminates 200. In other embodiments, one pre-preg sheet 402 may contact both the patterned layer 204 of one of the plurality of double-sided laminates 200 and the patterned layer 206 of another one of the plurality of double-sided laminates 200. In still other embodiments, three or more pre-preg sheets 402 may each contact both the patterned layer 204 of one of the plurality of double-sided laminates 200 and the patterned layer 206 of another one of the plurality of double-sided laminates 200. In the illustrative embodiment of FIG. 4, two of the plurality of pre-preg sheets 402 contact outer sheets 404 of electrically conductive materials.

Figure 5:
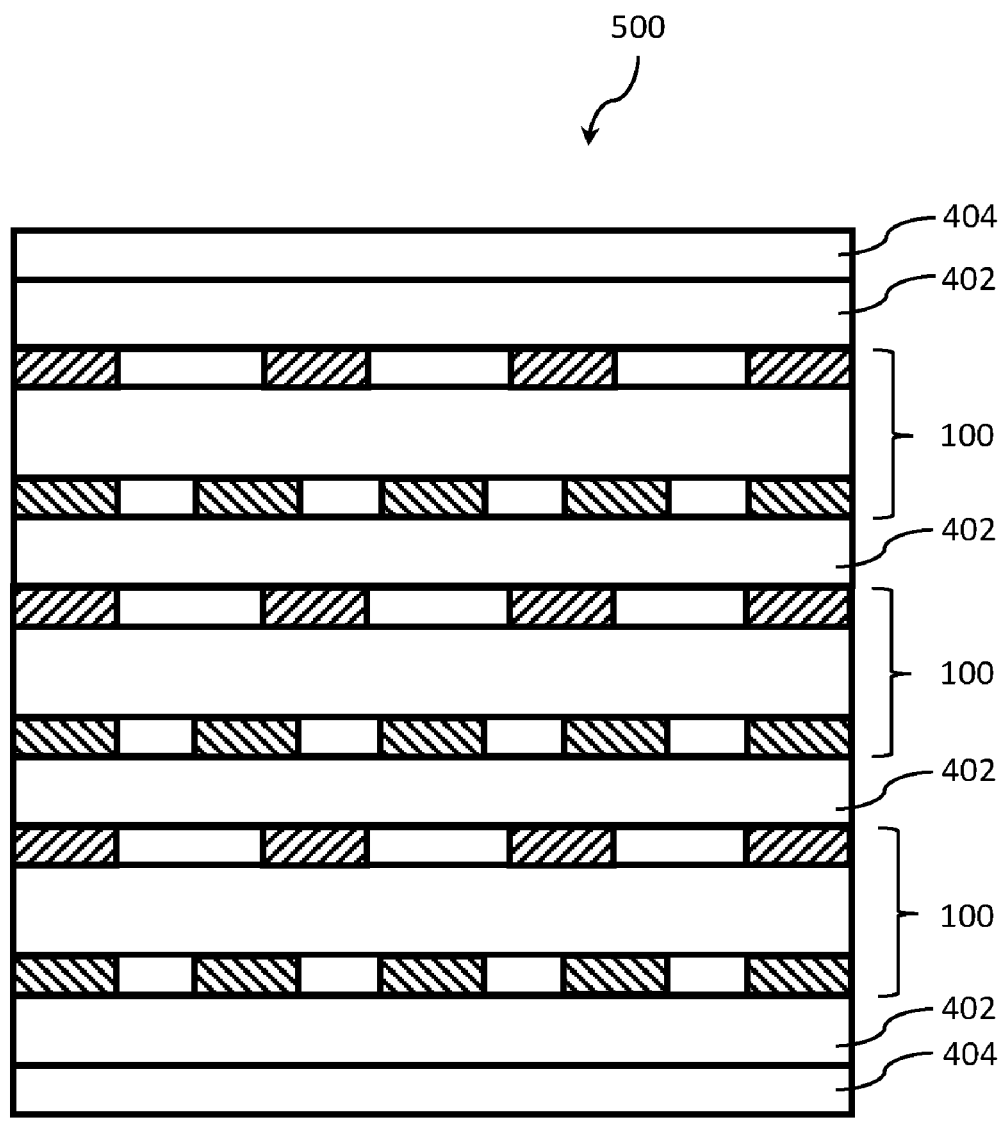
FIG. 5 is an illustrative diagram showing a cross-section of a printed circuit board according to the present disclosure, assembled from a plurality of the double-sided laminates of FIG. 1 (after the addition of a thermally conductive, electrically insulating additive resin).

Referring now to FIG. 5, another illustrative embodiment of a printed circuit board ("PCB") 500 according to the present disclosure is shown in cross-section. The PCB 500 is assembled from a plurality of the double-sided laminates 100, among other components. While the PCB 500 includes three of the double-sided laminates 100 in the illustrative embodiment of FIG. 5, it is contemplated that the PCB 500 may include any number of double-sided laminates 100 in other embodiments. The features of the double-sided laminates 100 are substantially the same as discussed above with reference to FIGS. 1 and 3 (as such, the component parts of the double-sided laminates 100 have not been labelled in FIG. 5 so as not to obscure the disclosure). The remaining features of the PCB 500, and its assembly, are substantially the same as describe with regard to the PCB 400 of FIG. 4.

Both the PCB 400 and the PCB 500 have specific utility in fabricating power supplies, which require high thermal performance in small packages (e.g., quarter-bricks). For instance, the PCBs 400, 500 may be used to fabricate quarter-brick power converters with greater than 95 percent efficiency. By way of example, the PCB 400 (or PCB 500) may be used in fabricating a quarter-brick power converter with a power density greater than 1000 Watts and an efficiency greater than 97 percent. As another example, the PCB 400 (or PCB 500) may be used in fabricating a point-of-load buck converter with currents exceeding 80 amps and an efficiency greater than 97 percent.

While certain illustrative embodiments have been described in detail in the figures and the foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the methods, systems, and articles described herein. It will be noted that alternative embodiments of the methods, systems, and articles of the present disclosure may not include all of the features described yet still benefit from at least some of the advantages of such features. Those of ordinary skill in the art may readily devise their own implementations of the methods, systems, and articles that incorporate one or more of the features of the present disclosure.

The invention claimed is:

1. A power supply comprising:
a printed circuit board comprising:
a plurality of pre-formed double-sided laminates, each pre-formed double-sided laminate of the plurality of pre-formed double-sided laminates comprising (i) an electrically insulating core, (ii) a first patterned layer of electrically conductive material arranged on a first side of the electrically insulating core, and (iii) a second patterned layer of electrically conductive material arranged on a second side of the electrically insulating core opposite the first side;
a plurality of thermally conductive, electrically insulating pre-preg sheets interleaved with the plurality of pre-formed double-sided laminates, wherein each one of the plurality of pre-preg sheets contacts both (i) the first patterned layer of one of the plurality of pre-formed double-sided laminates and (ii) the second patterned layer of another one of the plurality of pre-formed double-sided laminates; and
a thermally conductive, electrically insulating additive resin filling spaces between the electrically conductive material in both the first and second patterned layers of each of the plurality of pre-formed double-sided laminates, such that the electrically conductive material and the additive resin together form planar surfaces that contact the plurality of pre-preg sheets, wherein the additive resin is comprised of a different material than the pre-preg sheets.

2. The power supply of claim 1, wherein the first patterned layer of one of the plurality of pre-formed double-sided laminates is spaced less than 4 mils from the second patterned layer of another one of the plurality of pre-formed double-sided laminates.

3. The power supply of claim 1, wherein each of the plurality of pre-preg sheets has a thermal conductivity greater than 2 Watts/meter-Kelvin.

4. The power supply of claim 3, wherein the electrically insulating core of each of the plurality of pre-formed double-sided laminates comprises a cured pre-preg sheet having a thermal conductivity greater than 2 Watts/meter-Kelvin.

5. The power supply of claim 3, wherein the additive resin has a thermal conductivity greater than 0.3 Watts/meter-Kelvin.

6. The power supply of claim 3, wherein each of the plurality of pre-preg sheets and the additive resin provides dielectric isolation of at least 500 Volts/mil.

7. The power supply of claim 1, wherein a thermal performance of the printed circuit board is more uniform than and at least 7 percent more efficient than another printed circuit board lacking the additive resin.

8. The power supply of claim 1, wherein the power supply comprises a quarter-brick power converter with greater than 95 percent efficiency.

9. A plurality of pre-formed double-sided laminates for fabricating a printed circuit board for a power supply, the plurality of pre-formed double-sided laminates each comprising:
an electrically insulating core comprising a pre-preg sheet having a thermal conductivity greater than 2 Watts/meter-Kelvin;
a first patterned layer of electrically conductive material arranged on a first side of the electrically insulating pre-preg sheet; and
a second patterned layer of electrically conductive material arranged on a second side of the electrically insulating pre-preg sheet opposite the first side;
wherein a thermally conductive, electrically insulating additive resin fills spaces between the electrically conductive material in both the first and second patterned layers, such that the electrically conductive material and the additive resin together form planar outer surfaces of the double-sided laminate, wherein a plurality of thermally conductive, electrically insulating pre-preg sheets are interleaved between the plurality of pre-formed double-sided laminates such that each one of the plurality of pre-preg sheets contacts both (i) the first patterned layer of one of the plurality of pre-formed double-sided laminates and (ii) the second patterned layer of another one of the plurality of pre-formed double-sided laminates, and wherein the additive resin is comprised of a different material than the pre-preg sheets.

10. The double-sided laminate of claim 9, wherein the additive resin has a thermal conductivity greater than 0.3 Watts/meter-Kelvin.

11. The double-sided laminate of claim 10, wherein the pre-preg sheet of the core and the additive resin each provide dielectric isolation of at least 500 Volts/mil.

12. A method for fabricating a printed circuit board for a power supply, the method comprising:
forming a pre-formed double-sided laminate of a plurality of double-sided laminates by:
applying a thermally conductive, electrically insulating additive resin to fill spaces between patterned electrically conductive material arranged on a first side of a first electrically insulating core, such that the electrically conductive material and the additive resin together form a first planar surface on the first side of the first core; and
applying the additive resin to fill spaces between patterned electrically conductive material arranged on a second side of a second electrically insulating core, such that the electrically conductive material and the additive resin together form a second planar surface on the second side of the second core;
contacting the first planar surface of each of the plurality of double-sided laminates with a first side of a first thermally conductive, electrically insulating pre-preg sheet of a plurality of thermally conductive, electrically insulating pre-preg sheets; and
contacting the second planar surface of each of the plurality of double-sided laminates with a second side of the first pre-preg sheet, the second side of the first pre-preg sheet being opposite the first side of the first pre-preg sheet, wherein each of the plurality of pre-preg sheets is interleaved between the plurality of pre-formed double-sided laminates such that one of the plurality of pre-preg sheets contacts both (i) the first planar surface of one of the plurality of pre-formed double-sided laminates and (ii) the second planar surface of another one of the pre-formed plurality of double-sided laminates, and wherein the additive resin is comprised of a different material than the pre-preg sheets.

13. The method of claim 12, further comprising applying energy to transition the plurality of pre-preg sheets from a B-stage to a C-stage.

14. The method of claim 12, wherein the first pre-preg sheet has a thermal conductivity greater than 2 Watts/meter-Kelvin.

15. The method of claim 14, wherein the first and second cores are each a C-stage pre-preg sheet having a thermal conductivity greater than 2 Watts/meter-Kelvin.

16. The method of claim 14, wherein the additive resin has a thermal conductivity greater than 0.3 Watts/meter-Kelvin.

17. The method of claim 16, wherein the first pre-preg sheet and the additive resin each provide dielectric isolation of at least 500 Volts/mil.

18. The method of claim 12, further comprising:
applying the additive resin to fill spaces between patterned electrically conductive material arranged on a second side of the first electrically insulating core, the second side of the first core being opposite the first side of the first core, such that the electrically conductive material and the additive resin together form a third planar surface on the second side of the first core;
applying the additive resin to fill spaces between patterned electrically conductive material arranged on a first side of the second core, such that the electrically conductive material and the additive resin together form a fourth planar surface on the second side of the second core;
contacting the third planar surface with a second thermally conductive, electrically insulating pre-preg sheet of the plurality of pre-preg sheets; and
contacting the fourth planar surface with a third thermally conductive, electrically insulating pre-preg sheet of the plurality of pre-preg sheets.

19. The method of claim 18, wherein: the first, second, and third pre-preg sheets each have a thermal conductivity greater than 2 Watts/meter-Kelvin and each provide dielectric isolation of at least 500 Volts/mil; and provides dielectric isolation of at least 500 Volts/mil.

* * * * *